United States Patent
Choi et al.

(10) Patent No.: US 9,059,108 B2
(45) Date of Patent: Jun. 16, 2015

(54) INTEGRATED CIRCUIT PACKAGING SYSTEM WITH INTERCONNECTS

(75) Inventors: DaeSik Choi, Seoul (KR); JoonYoung Choi, Incheon (KR); YongHyuk Jeong, Kyungki-do (KR)

(73) Assignee: STATS ChipPAC Ltd., Singapore (SG)

( * ) Notice: Subject to any disclaimer, the term of this patent is extended or adjusted under 35 U.S.C. 154(b) by 225 days.

(21) Appl. No.: 13/407,554

(22) Filed: Feb. 28, 2012

(65) Prior Publication Data
US 2013/0221543 A1 Aug. 29, 2013

(51) Int. Cl.
| | | |
|---|---|---|
| H01L 23/495 | (2006.01) | |
| H01L 23/31 | (2006.01) | |
| H01L 21/56 | (2006.01) | |
| H01L 25/10 | (2006.01) | |
| H01L 23/00 | (2006.01) | |
| H01L 23/498 | (2006.01) | |

(52) U.S. Cl.
CPC ........ *H01L 23/3128* (2013.01); *H01L 23/3135* (2013.01); *H01L 21/565* (2013.01); *H01L 25/105* (2013.01); H01L 2224/16225 (2013.01); H01L 2224/32145 (2013.01); H01L 2224/32245 (2013.01); H01L 2224/48227 (2013.01); H01L 2224/48247 (2013.01); H01L 2224/73253 (2013.01); H01L 2224/73265 (2013.01); H01L 2225/0651 (2013.01); H01L 2225/06517 (2013.01); H01L 2225/1023 (2013.01); H01L 2225/1058 (2013.01); H01L 2225/1082 (2013.01); H01L 2924/15311 (2013.01); H01L 2225/06558 (2013.01); H01L 24/16 (2013.01); H01L 24/32 (2013.01); H01L 24/48 (2013.01); H01L 24/73 (2013.01); H01L 2224/0401 (2013.01); H01L 2224/04042 (2013.01); H01L 2224/32225 (2013.01); *H01L 2225/06568* (2013.01); *H01L 23/49816* (2013.01); *H01L 23/49827* (2013.01)

(58) Field of Classification Search
CPC ........... H01L 2224/73265; H01L 2224/48091; H01L 2224/83192; H01L 23/4951; H01L 23/49575; H01L 24/06; H01L 2224/1058
USPC .................................. 257/777, 686, 690, 692
See application file for complete search history.

(56) References Cited

U.S. PATENT DOCUMENTS

| | | | |
|---|---|---|---|
| 7,345,361 B2 | 3/2008 | Mallik et al. | |
| 7,986,043 B2 | 7/2011 | Merilo et al. | |
| 8,039,275 B1 | 10/2011 | Bae et al. | |
| 8,067,307 B2 | 11/2011 | Choi et al. | |
| 2008/0067642 A1* | 3/2008 | Koon et al. | 257/666 |
| 2010/0327420 A1 | 12/2010 | Xiao et al. | |
| 2011/0169154 A1* | 7/2011 | Kweon et al. | 257/686 |

OTHER PUBLICATIONS

McGraw-Hill, "Definition of Cavity", "McGraw-Hill Dictionary of Scientific and Technical Terms", Copyright 2003, p. 348, Sixth Edition, Publisher: The McGraw-Hill Companies, Inc., Published in: New York.

* cited by examiner

*Primary Examiner* — Howard Weiss
*Assistant Examiner* — Tifney Skyles
(74) *Attorney, Agent, or Firm* — Ishimaru & Associates LLP

(57) ABSTRACT

A method of manufacture of an integrated circuit packaging system includes: providing a base substrate; mounting a base integrated circuit over the base substrate; attaching a lead to the base integrated circuit and the base substrate, the lead having a lead attachment portion over the base integrated circuit; and forming a base encapsulation over the lead, the base encapsulation having a cavity exposing the lead attachment portion.

10 Claims, 5 Drawing Sheets

INTEGRATED CIRCUIT PACKAGING SYSTEM WITH INTERCONNECTS

TECHNICAL FIELD

The present invention relates generally to an integrated circuit packaging system, and more particularly to a system for an integrated circuit packaging system with interconnects.

BACKGROUND ART

Increased miniaturization of components, greater packaging density of integrated circuits ("ICs"), higher performance, and lower cost are ongoing goals of the computer industry. Semiconductor package structures continue to advance toward miniaturization, to increase the density of the components that are packaged therein while decreasing the sizes of the products that are made therefrom. This is in response to continually increasing demands on information and communication products for ever-reduced sizes, thicknesses, and costs, along with ever-increasing performance.

These increasing requirements for miniaturization are particularly noteworthy, for example, in portable information and communication devices such as cellular phones, hands-free cellular phone headsets, personal data assistants ("PDA's"), camcorders, notebook computers, and so forth. All of these devices continue to be made smaller and thinner to improve their portability. Accordingly, large-scale IC ("LSI") packages that are incorporated into these devices are required to be made smaller and thinner. The package configurations that house and protect LSI require them to be made smaller and thinner as well.

Consumer electronics requirements demand more integrated circuits in an integrated circuit package while paradoxically providing less physical space in the system for the increased integrated circuits content. Continuous cost reduction is another requirement. Some technologies primarily focus on integrating more functions into each integrated circuit. Other technologies focus on stacking these integrated circuits into a single package. While these approaches provide more functions within an integrated circuit, they do not fully address the requirements for integration and cost reduction.

Thus, a need still remains for an integrated circuit packaging system providing integration, space savings, and low cost manufacturing. In view of the ever-increasing need to increase density of integrated circuits and particularly portable electronic products, it is increasingly critical that answers be found to these problems. In view of the ever-increasing commercial competitive pressures, along with growing consumer expectations and the diminishing opportunities for meaningful product differentiation in the marketplace, it is critical that answers be found for these problems. Additionally, the need to reduce costs, improve efficiencies and performance, and meet competitive pressures adds an even greater urgency to the critical necessity for finding answers to these problems.

Solutions to these problems have been long sought but prior developments have not taught or suggested any solutions and, thus, solutions to these problems have long eluded those skilled in the art.

DISCLOSURE OF THE INVENTION

The present invention provides a method of manufacture of an integrated circuit packaging system including: providing a base substrate; mounting a base integrated circuit over the base substrate; attaching a lead to the base integrated circuit and the base substrate, the lead having a lead attachment portion over the base integrated circuit; and forming a base encapsulation over the lead, the base encapsulation having a cavity exposing the lead attachment portion.

The present invention provides an integrated circuit packaging system, including: a base substrate; a base integrated circuit over the base substrate; a lead attached to the base integrated circuit and the base substrate, the lead having a lead attachment portion over the base integrated circuit; and a base encapsulation over the lead, the base encapsulation having a cavity exposing the lead attachment portion.

Certain embodiments of the invention have other steps or elements in addition to or in place of those mentioned above. The steps or elements will become apparent to those skilled in the art from a reading of the following detailed description when taken with reference to the accompanying drawings.

BEST MODE FOR CARRYING OUT THE INVENTION

Figure 1:
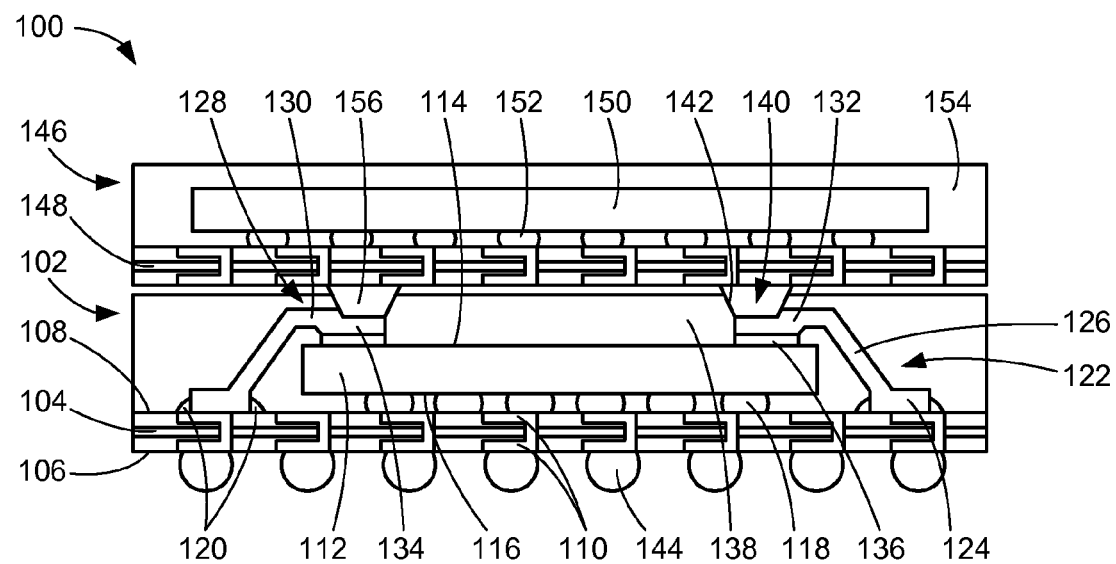
FIG. 1 is a cross-sectional view of an integrated circuit packaging system taken along line 1-1 of FIG. 2 in a first embodiment of the present invention.

The following embodiments are described in sufficient detail to enable those skilled in the art to make and use the invention. It is to be understood that other embodiments would be evident based on the present disclosure, and that system, process, or mechanical changes may be made without departing from the scope of the present invention.

In the following description, numerous specific details are given to provide a thorough understanding of the invention. However, it will be apparent that the invention may be practiced without these specific details. In order to avoid obscuring the present invention, some well-known circuits, system configurations, and process steps are not disclosed in detail.

The drawings showing embodiments of the system are semi-diagrammatic and not to scale and, particularly, some of the dimensions are for the clarity of presentation and are shown exaggerated in the drawing FIGS. Similarly, although the views in the drawings for ease of description generally show similar orientations, this depiction in the FIGS. is arbitrary for the most part. Generally, the invention can be operated in any orientation.

Where multiple embodiments are disclosed and described having some features in common, for clarity and ease of illustration, description, and comprehension thereof, similar and like features one to another will ordinarily be described with similar reference numerals. The embodiments have been numbered first embodiment, second embodiment, etc. as a matter of descriptive convenience and are not intended to have any other significance or provide limitations for the present invention.

For expository purposes, the term "horizontal" as used herein is defined as a plane parallel to the plane of an active surface of the integrated circuit, regardless of its orientation. The term "vertical" refers to a direction perpendicular to the horizontal as just defined. Terms, such as "above", "below", "bottom", "top", "side" (as in "sidewall"), "higher", "lower", "upper", "over", and "under", are defined with respect to the horizontal plane, as shown in the figures.

The term "on" means that there is contact between elements. The term "directly on" means that there is direct contact between one element and another element without an intervening element.

The term "active side" refers to a side of a die, a module, a package, or an electronic structure having active circuitry fabricated thereon or having elements for connection to the active circuitry within the die, the module, the package, or the electronic structure. The term "processing" as used herein includes deposition of material or photoresist, patterning, exposure, development, etching, cleaning, and/or removal of the material or photoresist as required in forming a described structure.

Figure 2:
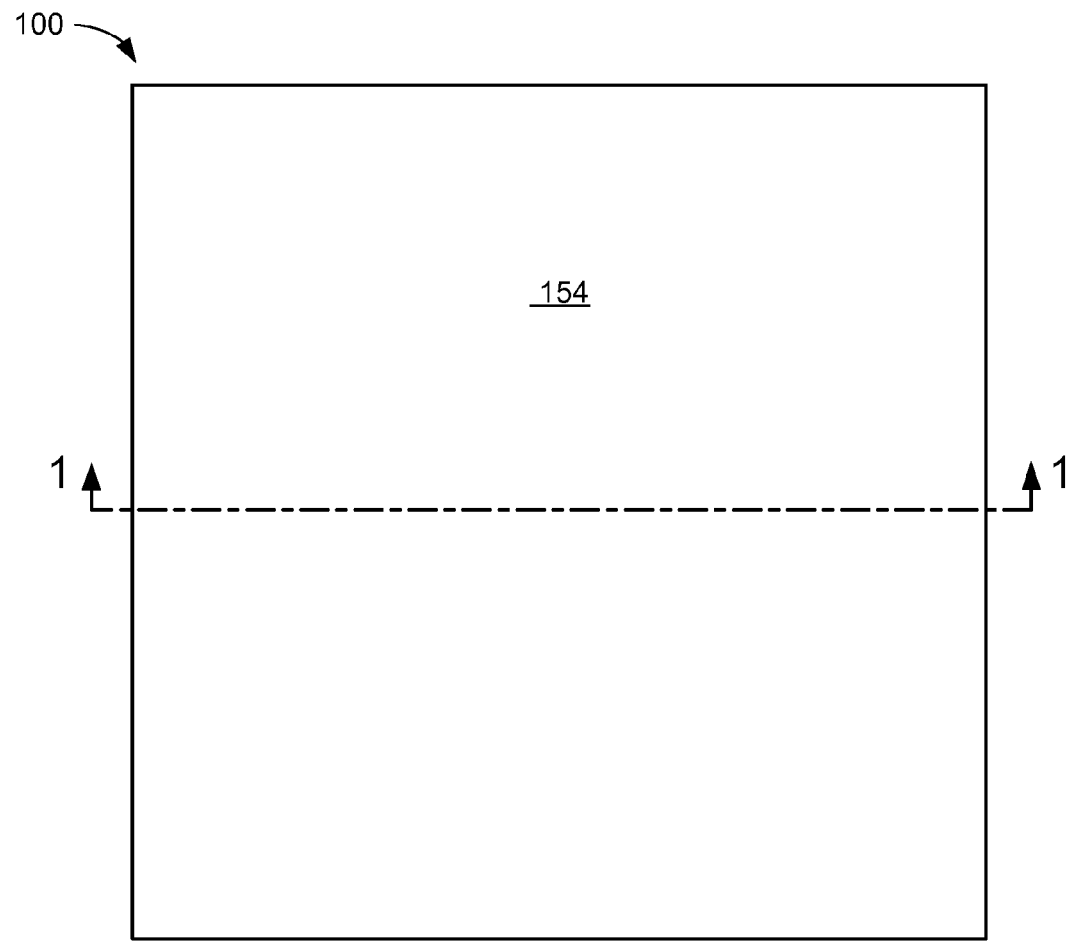
FIG. 2 is a top view of the integrated circuit packaging system.

Referring now to FIG. 1, therein is shown a cross-sectional view of an integrated circuit packaging system 100 taken along line 1-1 of FIG. 2 in a first embodiment of the present invention. The integrated circuit packaging system 100 can represent a packaging system with a molded laser package (MLP) structure using lead on chip (LOC).

The integrated circuit packaging system 100 can include a base package 102, which is defined as a semiconductor package. The base package 102 can include a base substrate 104, which is defined as a support structure for mounting and connecting an integrated circuit thereto including providing electrical connections through the support structure. The base substrate 104 can include a substrate bottom side 106 and a substrate top side 108.

The base substrate 104 can include a number of substrate pads 110, which are defined as electrically conductive structures for attaching electrical connectors thereto. The base substrate 104 can also include a number of vias, conductive layers, and traces, to provide electrical connectivity between the substrate bottom side 106 and the substrate top side 108 or between one of the substrate pads 110 and another of the substrate pads 110.

The base package 102 can include a base integrated circuit 112, which is defined as a semiconductor device having a number of integrated transistors interconnected to form active circuits. The base integrated circuit 112 can include a base inactive side 114 and a base active side 116. For example, the base integrated circuit 112 can represent a semiconductor device including a flip chip or an integrated circuit die. Also for example, the base inactive side 114 can represent a flip chip (FC) backside or a backside of the base integrated circuit 112.

The base integrated circuit 112 can be mounted over the substrate top side 108 without an intervening integrated circuit. The base active side 116 can be facing the substrate top side 108. For example, the base integrated circuit 112 can represent a semiconductor device including a flip chip, an integrated circuit die, or a wirebond integrated circuit.

The base package 102 can include base connectors 118, which are defined as electrically conductive connectors. The base connectors 118 can be attached to the substrate top side 108 and the base active side 116. For example, the base connectors 118 can represent electrically conductive connectors including conductive bumps.

The base package 102 can include a substrate-lead attach layer 120, which is defined as structure for attaching an electrical connector. The substrate-lead attach layer 120 can be attached to the substrate top side 108. For example, the substrate-lead attach layer 120 can include an attach adhesive or an adhesive tape. Also for example, the substrate-lead attach layer 120 can include an electrically or thermally conductive material.

The base package 102 can include leads 122, which are defined as electrical connectors. The leads 122 are formed from a leadframe (not shown). Each of the leads 122 can include a lead bottom portion 124, a lead connection portion 126, and a lead top portion 128. The lead top portion 128 can include a lead upper portion 130, a lead connection portion 132, and a lead attachment portion 134. For example, the leads 122 can represent a structure with lead on chip (LOC).

The lead bottom portion 124, the lead connection portion 126, and the lead top portion 128 can have approximately the same thickness. The lead bottom portion 124, the lead connection portion 126, and the lead top portion 128 can be formed as an integral structure having the same electrically conductive material.

The lead bottom portion 124 is a lowest portion of each of the leads 122. The lead bottom portion 124 can include a planar surface approximately parallel to and attached to the substrate top side 108. The lead connection portion 126 is connected to the lead bottom portion 124 and the lead upper portion 130. The lead connection portion 126 can upwardly extend from the lead bottom portion 124 to the lead upper portion 130. An upper surface of the lead connection portion 126 can be at an obtuse angle with an upper surface of the lead bottom portion 124 and at a reflex angle with an upper surface of the lead upper portion 130.

The lead upper portion 130 is a highest portion of each of the leads 122. The lead upper portion 130 can include a planar surface approximately parallel to the substrate top side 108 and the base inactive side 114. The lead top connection portion 132 is connected to the lead upper portion 130 and the lead attachment portion 134. The lead upper portion 130 can represent a step above the lead attachment portion 134 with the lead top connection portion 132 downwardly extending from the lead upper portion 130 to the lead attachment portion 134. An upper surface of the lead top connection portion 132 can be at a reflex angle with an upper surface of the lead upper portion 130 and at an obtuse angle with an upper surface of the lead attachment portion 134.

The lead attachment portion 134 is a portion of each of the leads 122 that provides a connection site for mounting a semiconductor package thereon or attaching an electrical connector thereto. The lead attachment portion 134 is lower than the lead upper portion 130. The lead attachment portion 134 can include a planar surface approximately parallel to the base inactive side 114. The lead attachment portion 134 can be directly over a periphery of the base inactive side 114. For example, the lead attachment portion 134 can represent an interconnecting pad or embedded solder-on-pad (eSOP) that is partially exposed from an encapsulation.

The base package 102 can include a device-lead attach layer 136, which is defined as a structure for mounting or attaching an electrical connector. The device-lead attach layer 136 can be attached to the lead attachment portion 134. The device-lead attach layer 136 can be directly on a bottom extent of the lead attachment portion 134.

For example, the device-lead attach layer 136 can include a conductive material or a non-conductive material. For a specific example, the device-lead attach layer 136 can preferably include a non-conductive material including an adhesive because a non-conductive material is cheaper than a conductive material.

The leads 122 can horizontally surround the base integrated circuit 112. The leads 122 can be mounted over the base integrated circuit 112. The lead bottom portion 124 can be mounted over the substrate top side 108. The substrate-lead attach layer 120 can be attached to a bottom extent of the lead bottom portion 124 and one of the substrate pads 110 at the substrate top side 108. The device-lead attach layer 136 can be attached to a periphery of the base inactive side 114 and a bottom extent of the lead attachment portion 134.

The base package 102 can include a base encapsulation 138, which is defined as a package cover of a semiconductor package to hermetically seal the semiconductor device as well as providing mechanical and environmental protection. The base encapsulation 138 can be formed over the base substrate 104, the base integrated circuit 112, the base connectors 118, the substrate-lead attach layer 120, the leads 122, and the device-lead attach layer 136.

The base encapsulation 138 can include cavities 140 at a top extent of the base encapsulation 138. The base encapsulation 138 can include sidewalls 142, each of which horizontally bounds each of the cavities 140. Each of the sidewalls 142 can be coplanar with an upper side of the lead top connection portion 132. Each of the cavities 140 exposes a top extent of the lead attachment portion 134 and a portion of the lead top connection portion 132. A top surface of the exposed top extent of the lead attachment portion 134 is lower than a top surface of the base encapsulation 138. Each of the cavities 140 exposes an upper side of the lead top connection portion 132.

The base package 102 can include base external connectors 144, which are defined as electrically conductive connectors. The base external connectors 144 can be attached to the substrate bottom side 106 and an external system (not shown). The base external connectors 144 can represent electrically conductive connectors including conductive balls or conductive bumps.

The integrated circuit packaging system 100 can include a stack package 146, which is defined as a semiconductor package. The stack package 146 can include a stack substrate 148, a stack integrated circuit 150, stack connectors 152, a stack encapsulation 154, and stack external connectors 156. For example, the stack package 146 can represent a memory device or chip.

The stack substrate 148 is defined as a support structure for mounting and connecting an integrated circuit thereto including providing electrical connections through the support structure. The stack integrated circuit 150 is defined as a semiconductor device having a number of integrated transistors interconnected to form active circuits. For example, the stack integrated circuit 150 can represent a semiconductor device including a flip chip or an integrated circuit die.

The stack connectors 152 are defined as electrically conductive connectors. The stack encapsulation 154 is defined as a package cover of a semiconductor package to hermetically seal the semiconductor device as well as providing mechanical and environmental protection. The stack external connectors 156 are defined as electrically conductive connectors.

The stack integrated circuit 150 can be mounted over a top extent of the stack substrate 148. The stack connectors 152 can be attached to the top extent of the stack substrate 148 and an active side of the stack integrated circuit 150. The stack encapsulation 154 can be formed over the stack substrate 148, the stack integrated circuit 150, and the stack connectors 152. The stack external connectors 156 can be attached to a bottom extent of the stack substrate 148.

The stack package 146 can be mounted over the base package 102. Each of the stack external connectors 156 can be attached to a top extent of the lead attachment portion 134 within each of the cavities 140. One of the stack external connectors 156 can be directly on the top extent of the lead attachment portion 134 and one of the sidewalls 142.

The cross-sectional view depicts a shape of each of the stack external connectors 156 after a reflow process. Each of the stack external connectors 156 can conform to contours of a top extent of the lead attachment portion 134 and each of the sidewalls 142. In other words, each of the stack external connectors 156 can be formed in the space bounded by the top extent of the lead attachment portion 134 and each of the sidewalls 142. Each of the stack external connectors 156 can be directly on the lead attachment portion 134 and each of the sidewalls 142.

The leads 122 can provide electrical connectivity between the base substrate 104 and the stack package 146. The leads 122 can provide electrical connectivity between the stack package 146 and the external system with the leads 122 electrically connected to the base substrate 104

The stack integrated circuit 150 can be electrically connected to the external system with the stack integrated circuit 150, the stack connectors 152, the stack substrate 148, the stack external connectors 156, the leads 122, the base substrate 104, and the base external connectors 144 electrically connected to each other. The stack integrated circuit 150 can be electrically connected to the base integrated circuit 112 with the stack integrated circuit 150, the stack connectors 152, the stack substrate 148, the stack external connectors 156, the leads 122, the base substrate 104, the base connectors 118, and the base integrated circuit 112 electrically connected to each other.

The top extent of the lead attachment portion 134 exposed by each of the cavities 140 can represent an exposed lead on chip (LOC) structure with molded laser package (MLP). An electrical signal can be transmitted between the base package 102 and the stack package 146 with one of the stack external connectors 156 connected to the lead attachment portion 134.

It has been discovered that the base encapsulation 138 having the cavities 140 horizontally bounded by the sidewalls 142 to expose the lead attachment portion 134 provides an advantage of improved reliability without issues of snow balls, opens, and misalignment as well as other advantages including reduced time for laser ablation and improved interconnection between the base package 102 and the stack package 146.

It has been discovered that the leads 122 provide improved reliability since the leads 122 made from leadframes are used for interconnecting the base package 102 and the stack package 146 instead of using solder bumps, which have reliability problems with narrow inner holes using laser ablation.

It has been discovered that the lead top portion 128 below a top extent of the base encapsulation 138 provides reduced package height profile since the stack external connectors 156 are attached within the cavities 140 with an overall package height reduction of approximately equal to or less than the height of one of the stack external connectors 156.

It has been discovered that each of the stack external connectors 156 conforming to a top extent of the lead attachment portion 134 and the sidewalls 142 provides improved reliability since each of the stack external connectors 156 has a robust structural integrity.

It has been discovered that the lead upper portion 130 higher than the lead attachment portion 134 provides improved reliability since there is an increase in spacing between the lead top connection portion 132 and the base integrated circuit 112 to reliably mount the leads 122.

Referring now to FIG. 2, therein is shown a top view of the integrated circuit packaging system 100. The top view depicts the stack encapsulation 154 of the stack package 146 of FIG. 1.

Figure 3:
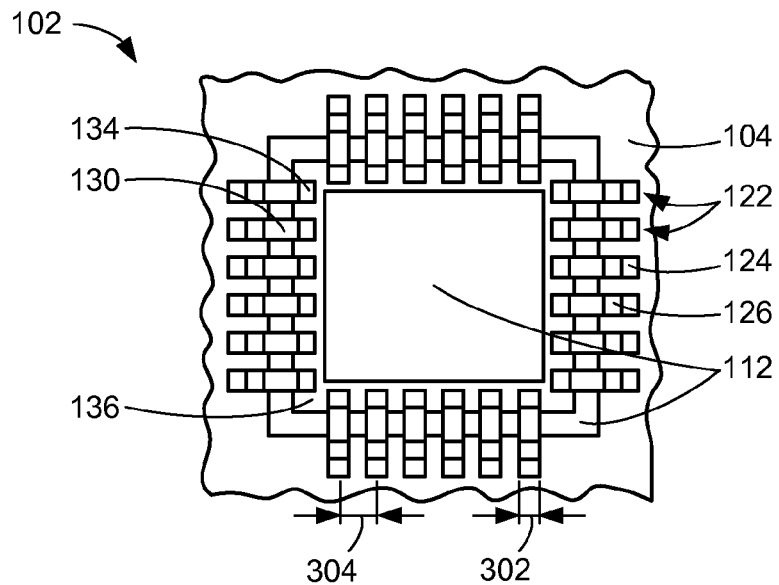
FIG. 3 is a top plan view of a portion of the base package.

Referring now to FIG. 3, therein is shown a top plan view of a portion of the base package 102. The top plan view depicts the base package 102 without the substrate-lead attach layer 120 of FIG. 1 and the base encapsulation 138 of FIG. 1.

The leads 122 can be formed in an array along each of peripheral sides of the base integrated circuit 112. The device-lead attach layer 136 can be formed with a ring shape inside and along a perimeter of the base integrated circuit 112.

The leads 122 are shown with the lead bottom portion 124, the lead connection portion 126, the lead upper portion 130, and the lead attachment portion 134. For illustrative purposes, the top plan view is shown without the lead top connection portion 132 of FIG. 1, although it is understood that the lead top connection portion 132 can be shown extending from the lead upper portion 130 to the lead attachment portion 134.

The lead connection portion 126 can extend from the lead bottom portion 124 to the lead upper portion 130 in a direction along each of the peripheral sides of the base integrated circuit 112. The lead upper portion 130 can be directly over the base substrate 104, the base integrated circuit 112, and the device-lead attach layer 136. The lead attachment portion 134 can be directly over the device-lead attach layer 136.

For example, a width 302 of each of the leads 122 can have an approximate range from 0.1 to 0.4 millimeters (mm). Also for example, a pitch 304 can have an approximate range from 0.1 to 0.8 mm. Further for example, a number of the leads 122 can be in an approximate range from 48 to 200 for a flip chip having a size of 10 mm×10 mm.

It has been discovered that the leads 122 having the width 302 and the pitch 304 provide improved horizontal package profile with the width 302 and the pitch 304 reduced resulting in finer pitch since the lead attachment portion 134 is brought toward a periphery of the base integrated circuit 112.

Figure 4:
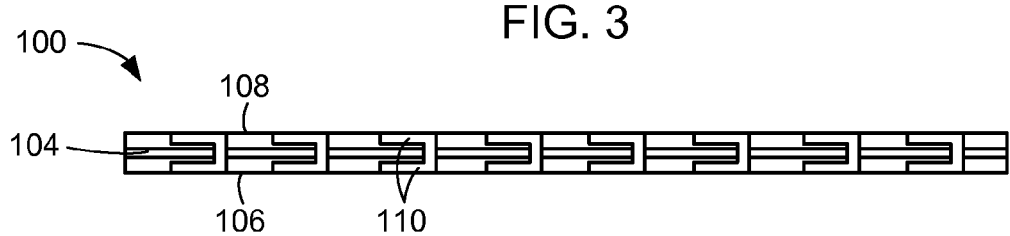
FIG. 4 is a cross-sectional view of the integrated circuit packaging system in a substrate-providing phase of manufacture.

Referring now to FIG. 4, therein is shown a cross-sectional view of the integrated circuit packaging system 100 in a substrate-providing phase of manufacture. The substrate-providing phase can be part of a process flow of the integrated circuit packaging system 100. The cross-sectional view depicts the base substrate 104 having the substrate bottom side 106, the substrate top side 108, and the substrate pads 110.

Figure 5:
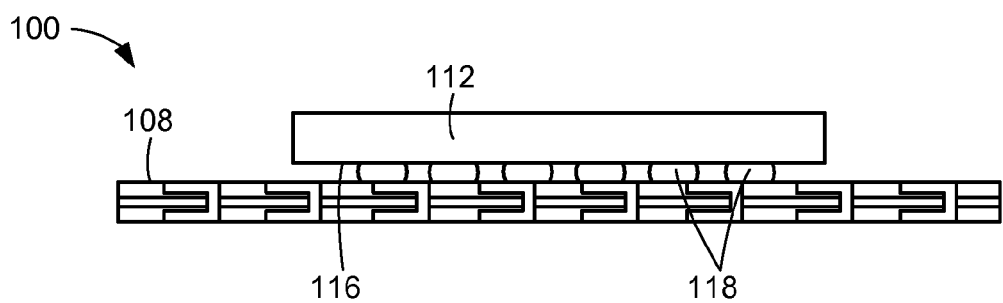
FIG. 5 is the structure of FIG. 4 in a first attachment phase.

Referring now to FIG. 5, therein is shown the structure of FIG. 4 in a first attachment phase. The base integrated circuit 112 can be mounted over the substrate top side 108 with the base active side 116 facing the substrate top side 108. The base connectors 118 can be attached to the substrate top side 108 and the base active side 116.

Figure 6:
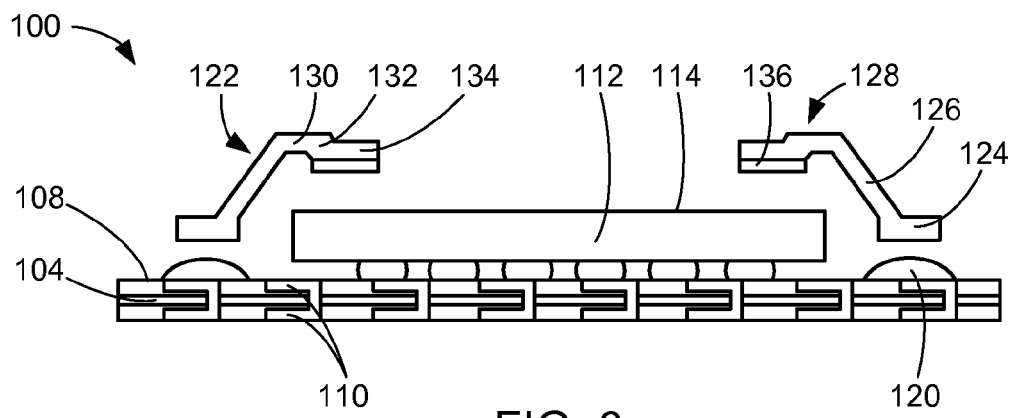
FIG. 6 is the structure of FIG. 5 in a second attachment phase.

Referring now to FIG. 6, therein is shown the structure of FIG. 5 in a second attachment phase. FIG. 6 depicts the leads 122 in a process of being mounted over the base substrate 104 and the base integrated circuit 112. The substrate-lead attach layer 120 can be attached to the substrate pads 110 before mounting the leads 122. For example, the substrate pads 110 can represent solder on pad (SOP).

The leads 122 or a semiconductor package (not shown) having the leads 122 can be mounted using a pick-and-place machine. Reflow can occur after the leads 122 or the semiconductor package is mounted. The leads 122 can be attached to the base inactive side 114 as well as the substrate top side 108 at same time at all four sides of the base integrated circuit 112 during reflow.

The leads 122 are formed from a leadframe (not shown). Each of the leads 122 can be bent to form the lead bottom portion 124, the lead connection portion 126, and the lead top portion 128 having the lead upper portion 130, the lead top connection portion 132, and the lead attachment portion 134.

The substrate-lead attach layer 120 can be attached to a bottom extent of the lead bottom portion 124 and one of the substrate pads 110 at the substrate top side 108. The device-lead attach layer 136 can be attached to the base inactive side 114 and a bottom extent of the lead attachment portion 134.

The second attachment phase can optionally include a stack chip or an additional semiconductor device mounted over the base integrated circuit 112. The second attachment phase can also optionally include additional electrically conductive connectors attached to the additional semiconductor device and the base integrated circuit 112.

Figure 7:
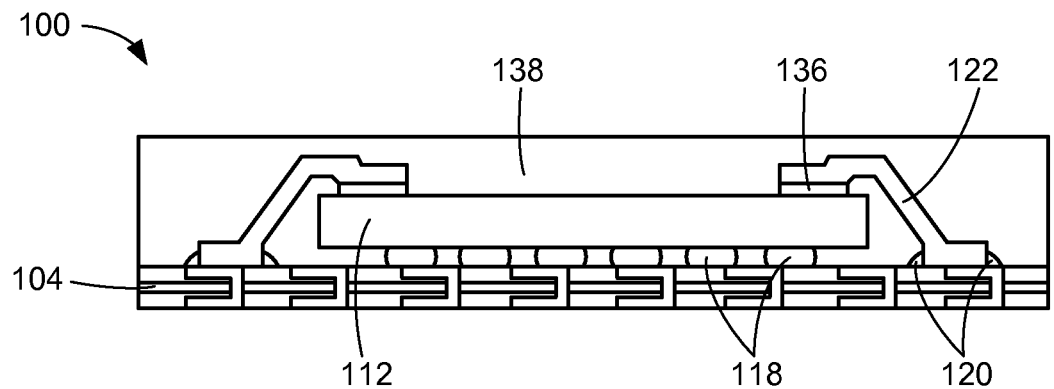
FIG. 7 is the structure of FIG. 6 in a molding phase.

Referring now to FIG. 7, therein is shown the structure of FIG. 6 in a molding phase. The base encapsulation 138 can be formed over the base substrate 104, the base integrated circuit 112, the base connectors 118, the substrate-lead attach layer 120, the leads 122, and the device-lead attach layer 136.

Figure 8:
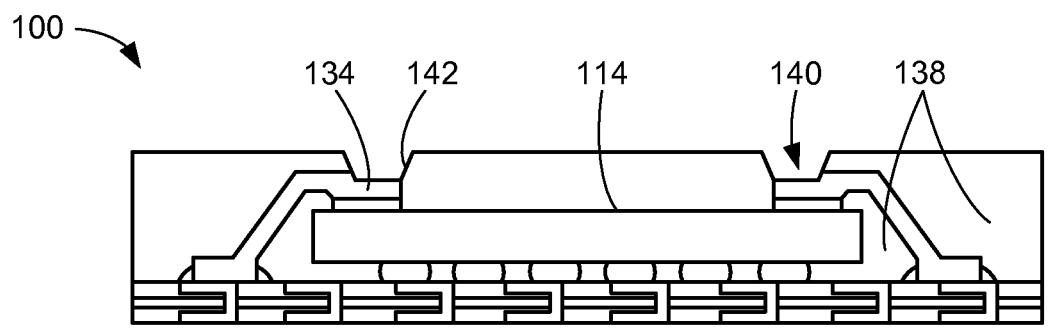
FIG. 8 is the structure of FIG. 7 in a recess-formation phase.

Referring now to FIG. 8, therein is shown the structure of FIG. 7 in a recess-formation phase. The cavities 140 horizontally bounded by the sidewalls 142 can be formed at a top extent of the base encapsulation 138. Each of the cavities 140 exposes a top extent of the lead attachment portion 134. The cavities 140 can be formed with a hole formation method including laser ablation or etching.

The lead attachment portion 134 and the sidewalls 142 can include physical marks including free of denting, free of chipping, free of mold flashing, approximately uniform surface planarity, polishing marks, shallow cavities, micro-recesses, laser-ablated marks, and any other removal marks. The lead attachment portion 134 and the sidewalls 142 can include the physical marks characteristic of the base encapsulation 138 being partially removed to form the cavities 140.

It has been discovered that the lead attachment portion 134 attached to a periphery of the base inactive side 114 provides improved reliability with the lead attachment portion 134 having a firmly fixed structure for the hole formation method to have an improved accuracy as well as an easy and rapid process to partially removing the base encapsulation 138 to form the cavities 140.

Figure 9:
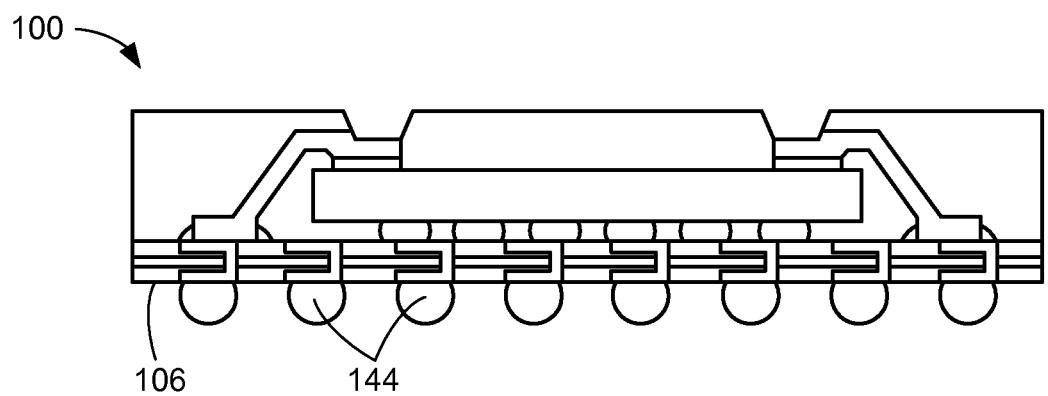
FIG. 9 is the structure of FIG. 8 in a third attachment phase.

Referring now to FIG. 9, therein is shown the structure of FIG. 8 in a third attachment phase. The base external connectors 144 can be attached to the substrate bottom side 106.

Figure 10:
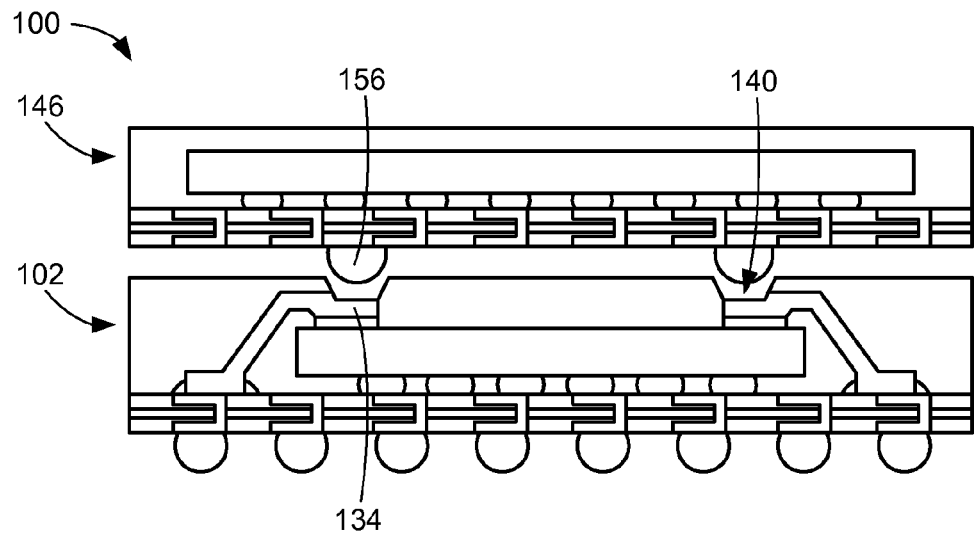
FIG. 10 is the structure of FIG. 9 in a package-stacking phase.

Referring now to FIG. 10, therein is shown the structure of FIG. 9 in a package-stacking phase. FIG. 10 depicts the stack package 146 in a process of being mounted over the base package 102. Each of the stack external connectors 156 can be attached to a top extent of the lead attachment portion 134 within each of the cavities 140. A reflow process can occur after the stack external connectors 156 are attached.

Figure 11:
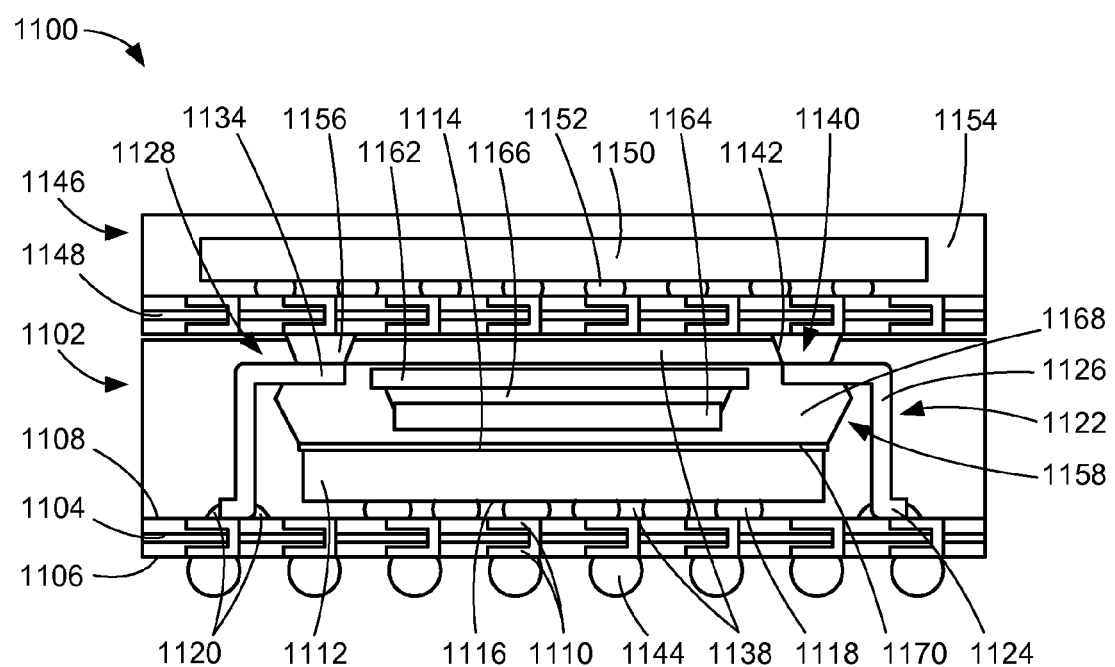
FIG. 11 is a cross-sectional view of an integrated circuit packaging system in a second embodiment of the present invention.

Referring now to FIG. 11, therein is shown a cross-sectional view of an integrated circuit packaging system 1100 in a second embodiment of the present invention. The integrated circuit packaging system 1100 can be used in a leadframe package (PKG) application.

In a manner similar to the integrated circuit packaging system 100 of FIG. 1, the integrated circuit packaging system 1100 includes a base package 1102 having a base substrate 1104 with a substrate bottom side 1106, a substrate top side 1108, and substrate pads 1110. In a manner similar to the integrated circuit packaging system 100, the base package 1102 includes a base integrated circuit 1112 having a base inactive side 1114 and a base active side 1116. In a manner similar to the integrated circuit packaging system 100, the base package 1102 includes base connectors 1118 and a substrate-lead attach layer 1120.

The base package 1102 also includes leads 1122, each of which having a lead bottom portion 1124, a lead connection portion 1126, and a lead top portion 1128 with a lead attachment portion 1134. The lead bottom portion 1124 can be approximately perpendicular to the lead connection portion 1126. The lead connection portion 1126 can be approximately perpendicular to the lead top portion 1128.

In a manner similar to the integrated circuit packaging system 100, the base package 1102 includes a base encapsulation 1138 with cavities 1140 and sidewalls 1142. In a manner similar to the integrated circuit packaging system 100, the base package 1102 includes base external connectors 1144.

In a manner similar to the integrated circuit packaging system 100, the integrated circuit packaging system 1100 includes a stack package 1146 having a stack substrate 1148, a stack integrated circuit 1150, stack connectors 1152, a stack encapsulation 1154, and stack external connectors 1156.

The base package 1102 can include an internal package 1158, which is defined as a semiconductor package. The internal package 1158 can include the leads 1122. The internal package 1158 can include an internal package paddle 1162, which is defined as a support structure for mounting and attaching an integrated circuit thereto. The internal package 1158 can include an internal integrated circuit 1164, which is defined as a semiconductor device having a number of integrated transistors interconnected to form active circuits. For example, the internal integrated circuit 1164 can represent a semiconductor device including a wirebond integrated circuit die.

The internal package 1158 can include an internal attach layer 1166, which is defined as a structure for mounting or attaching an integrated circuit. The internal integrated circuit 1164 can be mounted over the internal package paddle 1162 with an inactive side of the internal integrated circuit 1164 facing the internal package paddle 1162. The internal attach layer 1166 can be attached to the internal package paddle 1162 and the inactive side of the internal integrated circuit 1164.

The internal package 1158 can include an internal encapsulation 1168 formed over or directly on the lead top portion 1128, the internal package paddle 1162, the internal integrated circuit 1164, and the internal attach layer 1166. The lead bottom portion 1124, the lead connection portion 1126, and a portion of the lead top portion 1128 can be exposed from the internal encapsulation 1168. A top extent of the lead top portion 1128 can be coplanar with a top extent of the internal encapsulation 1168.

A top extent of the lead attachment portion 1134 can be coplanar with a top extent of the internal encapsulation 1168. For illustrative purposes, the internal encapsulation 1168 is shown covering a top extent of the internal package paddle 1162, although it is understood that a top extent of the internal encapsulation 1168 can be coplanar with a top extent of the internal package paddle 1162.

The base package 1102 can include a device attach layer 1170, which is defined as a structure for mounting or attaching a semiconductor package. The internal package 1158 can be mounted over the base integrated circuit 1112 with the device attach layer 1170 attached to a bottom extent of the internal encapsulation 1168 and the base inactive side 1114.

It has been discovered that the base encapsulation 1138 having the cavities 1140 horizontally bounded by the sidewalls 1142 to expose the lead attachment portion 1134 provides an advantage of improved reliability without issues of snow balls, opens, and misalignment as well as other advantages including reduced time during laser ablation and improved interconnection between the base package 1102 and the stack package 1146.

It has been discovered that the leads 1122 provide improved reliability since the leads 1122 made from leadframes are used for interconnecting the base package 1102 and the stack package 1146 instead of using solder bumps, which have reliability problems with narrow inner holes using laser ablation.

It has been discovered that the lead top portion 1128 below a top extent of the base encapsulation 1138 provides reduced package height profile since the stack external connectors 1156 are attached within the cavities 1140 with an overall package height reduction of approximately equal to or less than the height of one of the stack external connectors 1156.

It has been discovered that each of the stack external connectors 1156 conforming to a top extent of the lead attachment portion 1134 and the sidewalls 1142 provide improved reliability since each of the stack external connectors 1156 has a robust structural integrity.

It has been discovered that the leads 1122 being part of the internal package 1158 mounted over the base integrated circuit 1112 provide overall reduction in package height profile of the base package 1102.

Figure 12:
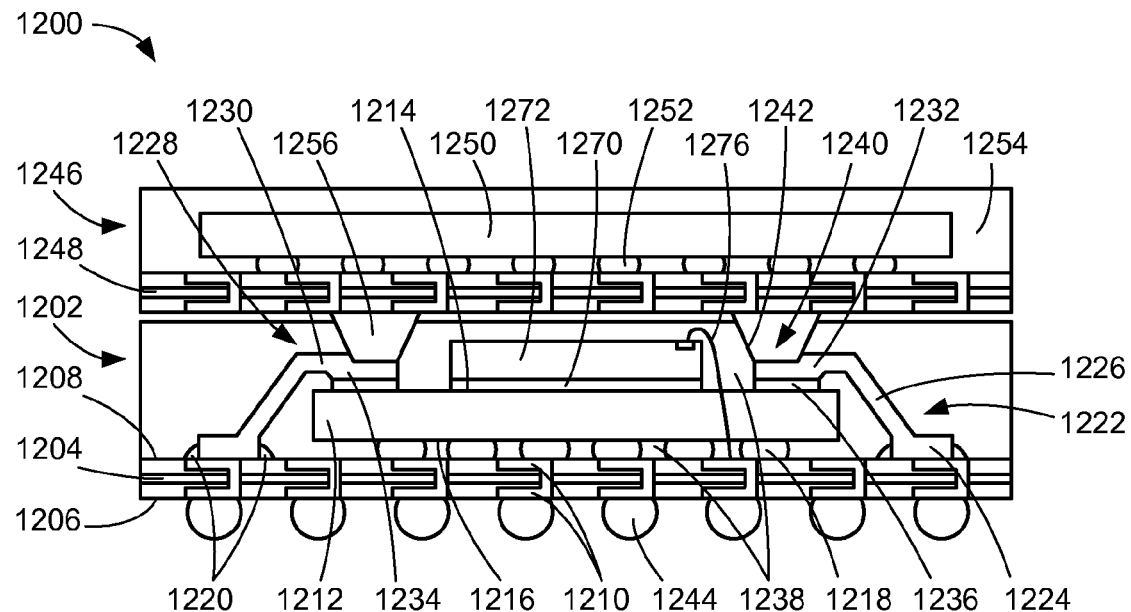
FIG. 12 is a cross-sectional view of an integrated circuit packaging system in a third embodiment of the present invention.

Referring now to FIG. 12, therein is shown a cross-sectional view of an integrated circuit packaging system 1200 in a third embodiment of the present invention. The integrated circuit packaging system 1200 can be used in a stack chip application.

In a manner similar to the integrated circuit packaging system 100 of FIG. 1, the integrated circuit packaging system 1200 includes a base package 1202 having a base substrate 1204 with a substrate bottom side 1206, a substrate top side 1208, and substrate pads 1210. In a manner similar to the integrated circuit packaging system 100, the base package 1202 includes a base integrated circuit 1212 having a base inactive side 1214 and a base active side 1216. In a manner similar to the integrated circuit packaging system 100, the base package 1202 includes base connectors 1218 and a substrate-lead attach layer 1220.

In a manner similar to the integrated circuit packaging system 100, the base package 1202 includes leads 1222, each of which having a lead bottom portion 1224, a lead connection portion 1226, and a lead top portion 1228 with a lead upper portion 1230, a lead top connection portion 1232, and a lead attachment portion 1234. In a manner similar to the integrated circuit packaging system 100, the base package 1202 includes a device-lead attach layer 1236 and a base encapsulation 1238 with cavities 1240 and sidewalls 1242.

In a manner similar to the integrated circuit packaging system 100, the base package 1202 includes base external connectors 1244. In a manner similar to the integrated circuit packaging system 100, the integrated circuit packaging system 1200 includes a stack package 1246 having a stack substrate 1248, a stack integrated circuit 1250, stack connectors 1252, a stack encapsulation 1254, and stack external connectors 1256.

The base package 1202 can include a device attach layer 1270, which is defined as a structure for mounting or attaching an integrated circuit. The base package 1202 can include an additional base integrated circuit 1272, which is defined as a semiconductor device having a number of integrated transistors interconnected to form active circuits. The additional base integrated circuit 1272 can be mounted over the base integrated circuit 1212 with the device attach layer 1270 attached to an inactive side of the additional base integrated circuit 1272 and the base inactive side 1214. The additional base integrated circuit 1272 can be horizontally surrounded by the leads 1222.

The base package 1202 can include additional base connectors 1276, which are defined as electrically conductive connectors. The additional base connectors 1276 can be directly attached to an active side of the additional base integrated circuit 1272 and the substrate pads 1210 at the substrate top side 1208. The base encapsulation 1238 can be formed over the device attach layer 1270, the additional base integrated circuit 1272, and the additional base connectors 1276.

It has been discovered that the base encapsulation 1238 having the cavities 1240 horizontally bounded by the sidewalls 1242 to expose the lead attachment portion 1234 provides an advantage of improved reliability without issues of snow balls, opens, and misalignment as well as other advantages including reduced time during laser ablation and improved interconnection between the base package 1202 and the stack package 1246.

It has been discovered that the leads 1222 provide improved reliability since the leads 1222 made from leadframes are used for interconnecting the base package 1202 and the stack package 1246 instead of using solder bumps, which have reliability problems with narrow inner holes using laser ablation.

It has been discovered that the lead top portion 1228 below a top extent of the base encapsulation 1238 provides reduced package height profile since the stack external connectors 1256 are attached within the cavities 1240 with an overall package height reduction of approximately equal to or less than the height of one of the stack external connectors 1256.

It has been discovered that each of the stack external connectors 1256 conforming to a top extent of the lead attachment portion 1234 and the sidewalls 1242 provide improved reliability since each of the stack external connectors 1256 has a robust structural integrity.

It has been discovered that the lead upper portion 1230 higher than the lead attachment portion 1234 provides improved reliability since there is an increase in spacing between the lead top connection portion 1232 and the base integrated circuit 1212 for mounting the leads 1222.

It has been discovered that the additional base integrated circuit 1272 horizontally surrounded by the leads 1222 provides overall reduction in package height profile of the integrated circuit packaging system 1200 since the additional base integrated circuit 1272 is able to be integrated into the base package 1202 without additional space required above the base package 1202.

Figure 13:
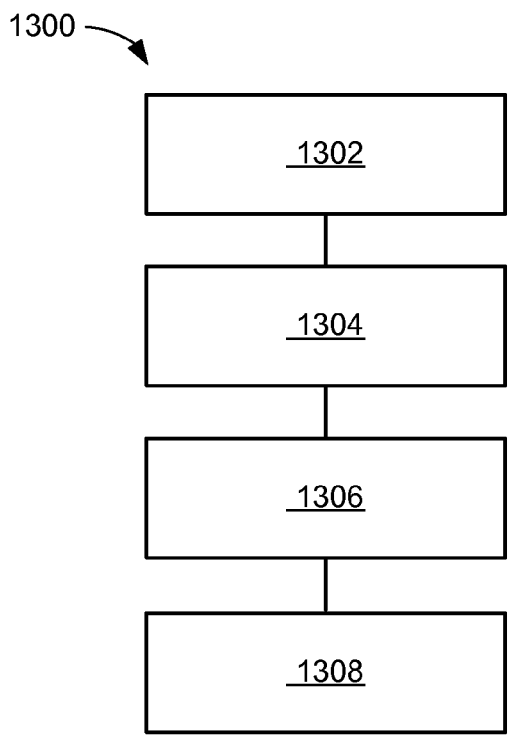
FIG. 13 is a flow chart of a method of manufacture of the integrated circuit packaging system of FIG. 1 in a further embodiment of the present invention.

Referring now to FIG. 13, therein is shown a flow chart of a method 1300 of manufacture of the integrated circuit packaging system 100 of FIG. 1 in a further embodiment of the present invention. The method 1300 includes: providing a base substrate in a block 1302; mounting a base integrated circuit over the base substrate in a block 1304; attaching a lead to the base integrated circuit and the base substrate, the lead having a lead attachment portion over the base integrated circuit in a block 1306; and forming a base encapsulation over the lead, the base encapsulation having a cavity exposing the lead attachment portion in a block 1308.

Thus, it has been discovered that the integrated circuit packaging system of the present invention furnishes important and heretofore unknown and unavailable solutions, capabilities, and functional aspects for an integrated circuit packaging system with interconnects. The resulting method, process, apparatus, device, product, and/or system is straightforward, cost-effective, uncomplicated, highly versatile and effective, can be surprisingly and unobviously implemented by adapting known technologies, and are thus readily suited for efficiently and economically manufacturing integrated circuit packaging systems fully compatible with conventional manufacturing methods or processes and technologies.

Another important aspect of the present invention is that it valuably supports and services the historical trend of reducing costs, simplifying systems, and increasing performance.

These and other valuable aspects of the present invention consequently further the state of the technology to at least the next level.

While the invention has been described in conjunction with a specific best mode, it is to be understood that many alternatives, modifications, and variations will be apparent to those skilled in the art in light of the aforegoing description. Accordingly, it is intended to embrace all such alternatives, modifications, and variations that fall within the scope of the included claims. All matters hitherto fore set forth herein or shown in the accompanying drawings are to be interpreted in an illustrative and non-limiting sense.

What is claimed is:

1. An integrated circuit packaging system comprising:
   a base substrate;
   a base integrated circuit over the base substrate;
   a lead attached to the base integrated circuit and the base substrate, the lead having a lead attachment portion over the base integrated circuit, a device-lead attach layer is attached to the base integrated circuit and the lead attachment portion; and
   a base encapsulation over the lead, the base encapsulation having a cavity exposing top surface of the lead attachment portion and a sidewall of a lead upper portion, wherein the top surface of the exposed lead attachment portion is lower than a top surface of the base encapsulation.

2. The system as claimed in claim 1 wherein the lead includes the lead upper portion and a lead top connection portion downwardly extending from the lead upper portion to the lead attachment portion.

3. The system as claimed in claim 1 wherein the lead is attached to a base inactive side of the base integrated circuit.

4. The system as claimed in claim 1 further comprising:
   an internal package paddle;
   an internal integrated circuit over the internal package paddle;
   an internal encapsulation over the internal integrated circuit and directly on the lead.

5. The system as claimed in claim 1 further comprising an additional base integrated circuit over the base integrated circuit.

6. The system as claimed in claim 1 further comprising a base connector attached to the base integrated circuit and the base substrate.

7. The system as claimed in claim 6 wherein:
the lead includes the lead upper portion and a lead top connection portion downwardly extending from the lead upper portion to the lead attachment portion; and
the base encapsulation includes the cavity partially exposing the lead top connection portion.

8. The system as claimed in claim 6 wherein the lead is attached to a periphery at a base inactive side of the base integrated circuit.

9. The system as claimed in claim 6 further comprising:
an internal package paddle;
an internal integrated circuit over the internal package paddle;
an internal encapsulation over the internal integrated circuit and directly on the lead, a top extent of the internal encapsulation coplanar with a top extent of the lead attachment portion.

10. The system as claimed in claim 6 further comprising:
an additional base integrated circuit over the base integrated circuit; and
an additional base connector directly attached to the additional base integrated circuit and the base substrate.

* * * * *